United States Patent
Wu et al.

(10) Patent No.: US 10,040,681 B2
(45) Date of Patent: Aug. 7, 2018

(54) METHOD AND SYSTEM FOR MEMS DEVICES

(75) Inventors: Hua-Shu Wu, Hsinchu (TW); Yu-Hao Chien, Taipei (TW); Shih-Yung Chung, Jhubei (TW); Li-Tien Tseng, Bade (TW); Yu-Te Yeh, Taichung County (TW)

(73) Assignee: Miradia Inc., Santa Clara, CA (US)

( * ) Notice: Subject to any disclaimer, the term of this patent is extended or adjusted under 35 U.S.C. 154(b) by 641 days.

(21) Appl. No.: 12/860,655

(22) Filed: Aug. 20, 2010

(65) Prior Publication Data

US 2011/0049652 A1 Mar. 3, 2011

Related U.S. Application Data

(60) Provisional application No. 61/238,085, filed on Aug. 28, 2009.

(51) Int. Cl.
*H01L 29/84* (2006.01)
*B81C 1/00* (2006.01)

(52) U.S. Cl.
CPC ...... *B81C 1/00246* (2013.01); *B81C 1/00269* (2013.01); *B81B 2201/0235* (2013.01); *B81B 2207/015* (2013.01); *B81C 2203/0109* (2013.01); *B81C 2203/0735* (2013.01)

(58) Field of Classification Search
CPC ....... H01L 2924/00; H01L 2924/00014; H01L 2924/0002; H01L 2924/1461; H01L 2224/48091; B81C 1/00269; B81C 2203/0118; B81C 2201/019; B81C 2203/0109; B81C 2203/019; B81C 1/00238; B81C 1/0023; B81B 7/007; B81B 2201/0235; B81B 7/0077

USPC .......................................... 257/415
See application file for complete search history.

(56) References Cited

U.S. PATENT DOCUMENTS

| | | | |
|---|---|---|---|
| 2004/0055380 A1* | 3/2004 | Shcheglov | G01C 19/5684 73/504.12 |
| 2004/0067604 A1* | 4/2004 | Ouellet et al. | 438/108 |
| 2004/0106294 A1* | 6/2004 | Lee | B81C 1/00269 438/691 |

(Continued)

OTHER PUBLICATIONS

Hybond, About Die Bonding.*
Wikipedia, Thermocompression bonding.*
Wikipedia, Eutectic bonding.*

*Primary Examiner* — David Chen
(74) *Attorney, Agent, or Firm* — Kilpatrick Townsend & Stockton LLP

(57) ABSTRACT

A micro electro-mechanical (MEMS) device assembly is provided. The MEMS device assembly includes a first substrate that has a plurality of electronic devices, a plurality of first bonding regions, and a plurality of second bonding regions. The MEMS device assembly also includes a second substrate that is bonded to the first substrate at the plurality of first bonding regions. A third substrate having a recessed region and a plurality of standoff structures is disposed over the second substrate and bonded to the first substrate at the plurality of second bonding regions. The plurality of first bonding regions provide a conductive path between the first substrate and the second substrate and the plurality of the second bonding regions provide a conductive path between the first substrate and the third substrate.

12 Claims, 14 Drawing Sheets

(56) References Cited

U.S. PATENT DOCUMENTS

| | | | |
|---|---|---|---|
| 2005/0057641 A1* | 3/2005 | Ogihara et al. | 347/238 |
| 2005/0106318 A1* | 5/2005 | Partridge et al. | 427/248.1 |
| 2006/0201249 A1* | 9/2006 | Horning | H02N 1/008 |
| | | | 73/504.14 |
| 2006/0234413 A1* | 10/2006 | Chilcott | B81B 3/001 |
| | | | 438/50 |
| 2007/0017287 A1* | 1/2007 | Kubena et al. | 73/504.02 |
| 2007/0054433 A1* | 3/2007 | DeNatale | B81C 1/0069 |
| | | | 438/48 |
| 2008/0131662 A1* | 6/2008 | Jordan | B81C 1/00269 |
| | | | 428/141 |
| 2009/0085191 A1* | 4/2009 | Najafi et al. | 257/698 |
| 2009/0120903 A1* | 5/2009 | Baik et al. | 216/33 |
| 2010/0024560 A1* | 2/2010 | Shcheglov | G01C 19/5684 |
| | | | 73/649 |
| 2010/0203718 A1* | 8/2010 | Foster et al. | 438/597 |
| 2010/0251818 A1* | 10/2010 | Ge | G01C 19/5684 |
| | | | 73/504.12 |

* cited by examiner

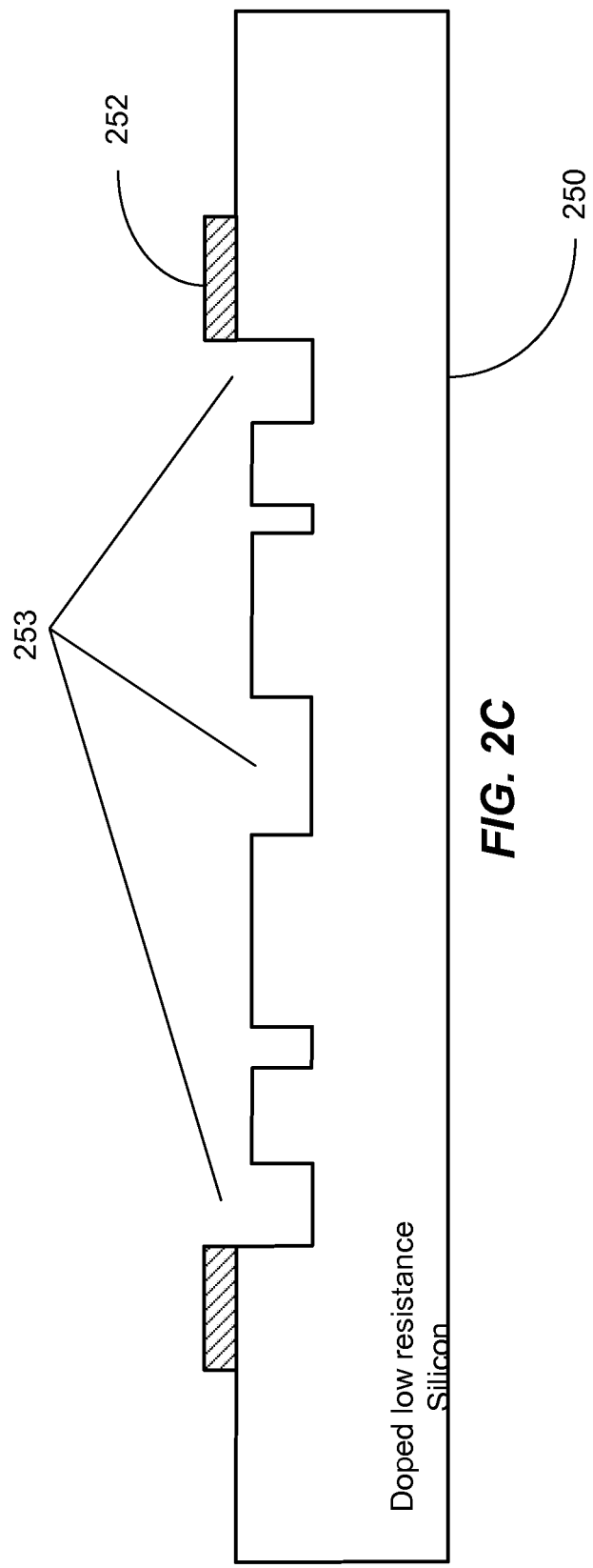

METHOD AND SYSTEM FOR MEMS DEVICES

CROSS-REFERENCES TO RELATED APPLICATIONS

The present application claims priority to U.S. Provisional Patent Application No. 61/238,085, filed on Aug. 28, 2009, entitled "Method and System for MEMS devices," the disclosure of which is hereby incorporated by reference in its entirety for all purposes.

BACKGROUND

Microelectrical-mechanical systems (MEMS) devices have experienced impressive and steady growth as they have integrated into people's everyday lives. Since their conceptualization in the 1970's, they have progressed from laboratory curiosity to integration in high-end systems, and, more recently, to widespread application in popular consumer devices.

A number of factors have fueled the growth in demand for MEMS devices, ranging from gains in performance and functionality to new processes to lower the manufacturing cost for the devices, to fundamental changes in the technology and materials used in the device manufacturing. Since MEMS contain by definition some sort of mechanical function, they present special challenges to fabrication and packaging technologies. While fabrication technologies have largely kept pace with market demand, the enormous difficulties in packaging such devices have weighed down its progress, resulting in an inappropriate proportion of costs (for some devices up to 80%) being relegated to the packaging area.

SUMMARY

According to embodiments of the present invention semiconductor processing techniques are provided. More particularly, the invention includes a method and structure for fabricating Micro-electro-mechanical structures (MEMS). Merely by way of example, the invention has been applied to a method of fabricating MEMS useful for motion sensing applications. The method and structure can be applied to other applications as well, such as actuators, sensors, and detectors.

In a specific embodiment of the present invention, a method of fabricating a micro electromechanical device is provided. The method includes providing a first substrate having a first surface and an opposing second surface, the first substrate including one or more electrodes and control circuitry. The first substrate includes a first bonding region disposed on the first surface and a second bonding region disposed on the first surface. The method further includes providing a second substrate that has a first surface and a second surface. Thereafter the method includes bonding the second substrate to the first substrate such that that at least a portion of the first surface of the second substrate is in contact with the first bonding region of the first substrate, forming a MEMS device in the second substrate, providing a capping substrate including a recessed region bordered by standoff structures, and bonding the capping substrate to the first surface of the first substrate to enclose the MEMS device within the recessed region. The capping substrate is bonded such that the standoff structures are in contact with the second bonding region of the first substrate and there is a first electrical path between the second substrate and the first substrate via the first bonding region and a second electrical path between the capping substrate and the first substrate via the second bonding region.

In another embodiment, a micro electro-mechanical (MEMS) device is provided. The MEMS device comprises a first substrate comprising a plurality of electronic devices disposed on an upper surface and the upper surface also comprises a plurality of first bonding regions and a plurality of second bonding regions. The MEMS device also includes a second substrate having a first surface and an opposing second surface. The second substrate being bonded to the first substrate such that a portion of the first surface of the second substrate is in contact with the plurality of first bonding regions. The MEMS device has a third substrate that has a recessed region and a plurality of standoff structures and is disposed over the second substrate and bonded to the first substrate such that the plurality of standoff structures are in contact with the plurality of second bonding regions. In the MEMS device, the plurality of first bonding regions provide a conductive path between the first substrate and the second substrate and the plurality of the second bonding regions provide a conductive path between the first substrate and the third substrate.

Numerous benefits are achieved using the present invention over conventional techniques. For example, embodiments of the present invention provide a shortened interconnect between sensing elements and sensing circuitry in comparison with conventional designs. As a result, parasitic effects are reduced, resulting in higher signal-to-noise ratios than other designs. Additionally, embodiments of the present invention provide implementations suitable for use with differential sensing circuitry. Moreover, in some embodiments, monolithic integration of the control/sensing circuitry and the MEMS structures in the vertical configurations described herein provides for a reduction or elimination in wire bonding between a central control chip and the elements of the accelerometer.

In the MEMS area, several substrate-bonding techniques are utilized. Each method has its advantages and disadvantages, owing to the material and processing costs, tolerance of manufacturing process variations, and final device performance. For example, anodic bonding uses an electric potential between a pyrex and a silicon substrate to enable an electric field assisted diffusion bond and requires no intermediate layer. Another bonding technique is glass frit bonding, which utilizes a deposition of a frit material onto one substrate prior to alignment and bonding. As the frit material densifies during the bond process, its shrinkage can lead to non-uniform bond line thicknesses, which could cause variations in device performance. Also, because the deposited frit material uses real estate on the wafer, its use hampers device scaling. Moreover, the viscous nature of the frit material during high-temperature bonding could lead to misalignments and non-uniform bond line thicknesses that could limit the design of smaller dies.

Fusion bonding, like anodic bonding, uses no intermediate layer between the two substrates. However, after the initial bonding at room temperature, the bond is annealed at temperatures at or above 1000° C. The surface requirements can present a challenge to achieving such a bond on processed surfaces or on substrates having CMOS circuitry. Furthermore, since there is no intermediate layer to compensate between substrates, even very small particles between substrates can lead to large voids in the bond.

Embodiments of the present invention provide a method for bonding substrates using eutectic bonding techniques in the fabrication of a MEMS package. Eutectic reactions are a triple point in the phase diagram where solid alloys mixtures transform directly to a liquid phase. Upon cooling, a microstructure is formed, which is both strong and hermetic. Eutectic metal compositions have several benefits as sealing materials, including the ability to accurately deposit and define the metals in desired patterns, the tolerance to surface deviations, roughness and particulates, plus metals' inherent hermeticity and conductivity. Hermeticity, the degree of air tightness for a vessel or package, is useful for MEMS packages because the mechanical and electrical functionality of the device within the package typically relies on critical environmental control. Change in the atmosphere inside the package can bring about a shift in performance or even a total failure of the device.

These and other embodiments of the invention along with many of its advantages and features are described in more detail in conjunction with the text below and attached figures.

BRIEF DESCRIPTION OF THE DRAWINGS

FIGS. 2A-2I show cross-sectional views of a micro electromechanical (MEMS) device during the fabrication process according to an embodiment of the present invention.

DETAILED DESCRIPTION OF SPECIFIC EMBODIMENTS

According to the embodiments of the present invention, semiconductor processing techniques are provided. More particularly, embodiments of the present invention include a method and structure for forming MEMS devices using semiconductor fabrication techniques. Merely by way of example, an embodiment provides a method of forming accelerometers and gyroscopes using a monolithic integration process, thereby reducing the die footprint by at least a factor of two. The method and structure can be applied to other applications as well, such as actuators, sensors, and detectors.

Figure 1:
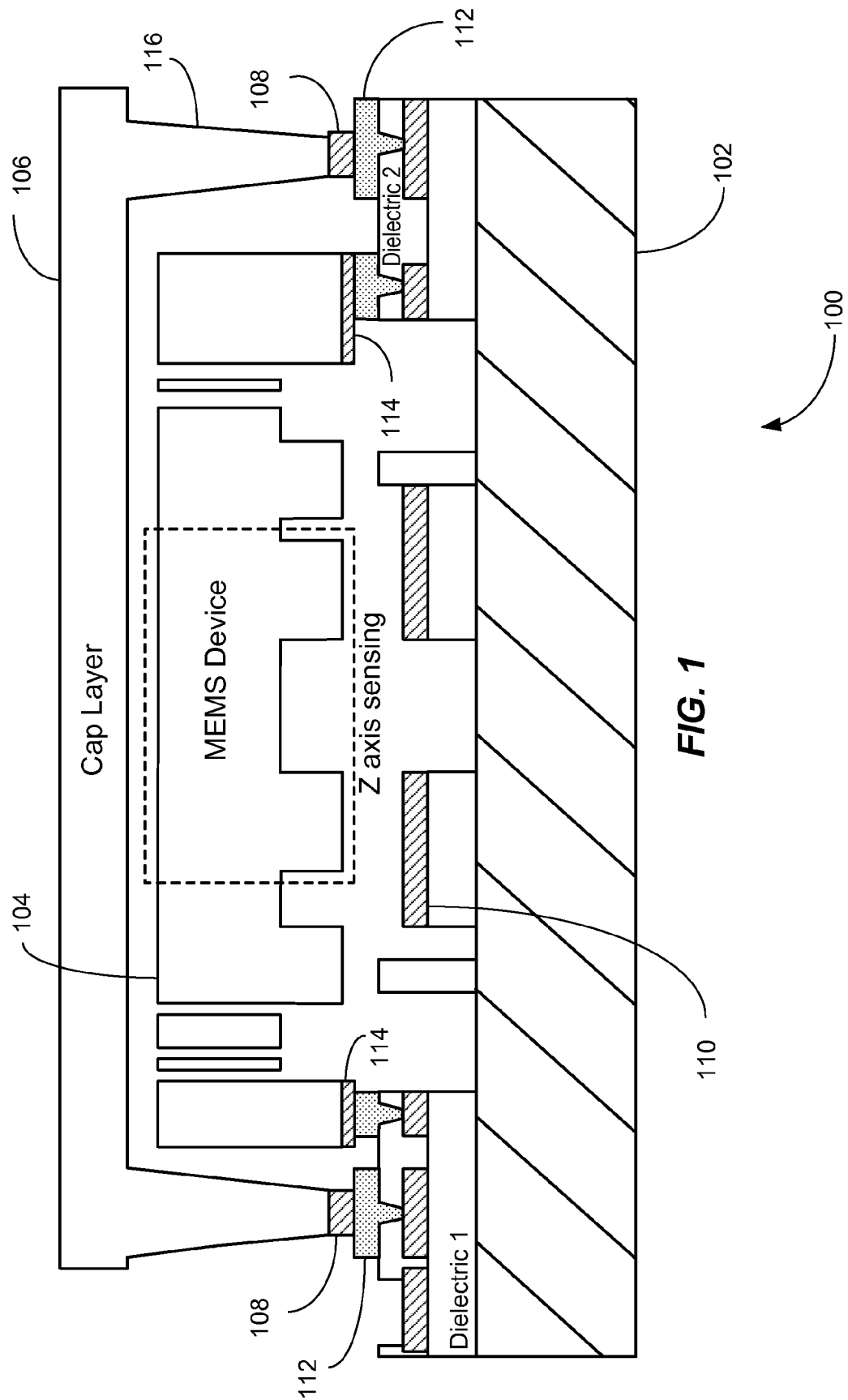
FIG. 1 illustrates a cross-sectional view of a MEMS device assembly according to an embodiment of the present invention.

FIG. 1 illustrates a cross-sectional view of a MEMS device assembly 100 according to an embodiment of the present invention. MEMS device assembly 100 includes a base substrate 102. In some embodiments, base substrate 102 can be a silicon substrate. Base substrate 102 includes a plurality of electrodes 110 disposed on an upper surface. Base substrate 102 also includes a plurality of conductive bonding regions 112 that are configured to accept a device substrate and a capping substrate. MEMS device assembly 100 also includes a device substrate 104 that includes one or more MEMS devices, e.g., an accelerometer, a gyroscope, or the like. The device substrate 104 is bonded to the base substrate 102 at one or more of the bonding regions 112. The device substrate 104 also includes specialized bonding areas 114.

Once bonded to the base substrate 102, the bonding interface including bonding regions 112 and bonding areas 114 form a composite conductive structure that provides an ohmic contact for facilitating electrical connection between the device substrate 104 and base substrate 102, thereby eliminating the need to provide a separate electrical path. A capping substrate 106 is disposed over the device substrate 104 such that the capping substrate 106 encloses one or more of the MEMS devices. Capping substrate 106 includes a plurality of standoff structures 116 that surround a cavity. Bonding pads 108 are disposed at distal ends of each of the standoff structures 116. The capping substrate 106 is eutectically bonded to the base substrate 102 such that the bonding pads 108, in conjunction with the bonding regions 112, form a low resistance conductive contact between the capping substrate 106 and the base substrate 102.

FIGS. 2A-2I are simplified schematic cross-sectional view illustrations showing a method of fabricating a MEMS device according to an embodiment of the present invention. The fabrication method starts with a base substrate 102. The base substrate 102 includes drive electronics, sense electronics, and the like. Typically implemented using ASIC design elements, analog and/or digital circuits can be utilized in the substrate. The base substrate 102 can also be referred to as an electrode substrate. According to embodiments of the present invention, base substrate 102 can be any suitable substrate having appropriate mechanical rigidity, including a CMOS substrate, a glass substrate, or the like. Although a single device is illustrated in these cross-sectional views, it will be appreciated that multiple dies are fabricated on a single substrate. Thus, the single device illustrated in these figures is only representative and is not intended to limit the present invention to fabrication methods for a single device. As described more fully throughout the present specification, wafer-scale processing is utilized to fabricate multiple dies or devices per substrate. After fabrication of the devices, dicing and singulation techniques are utilized to produce single device packages for use in various applications. One of ordinary skill in the art would recognize many variations, modifications, and alternatives.

Figure 2A:
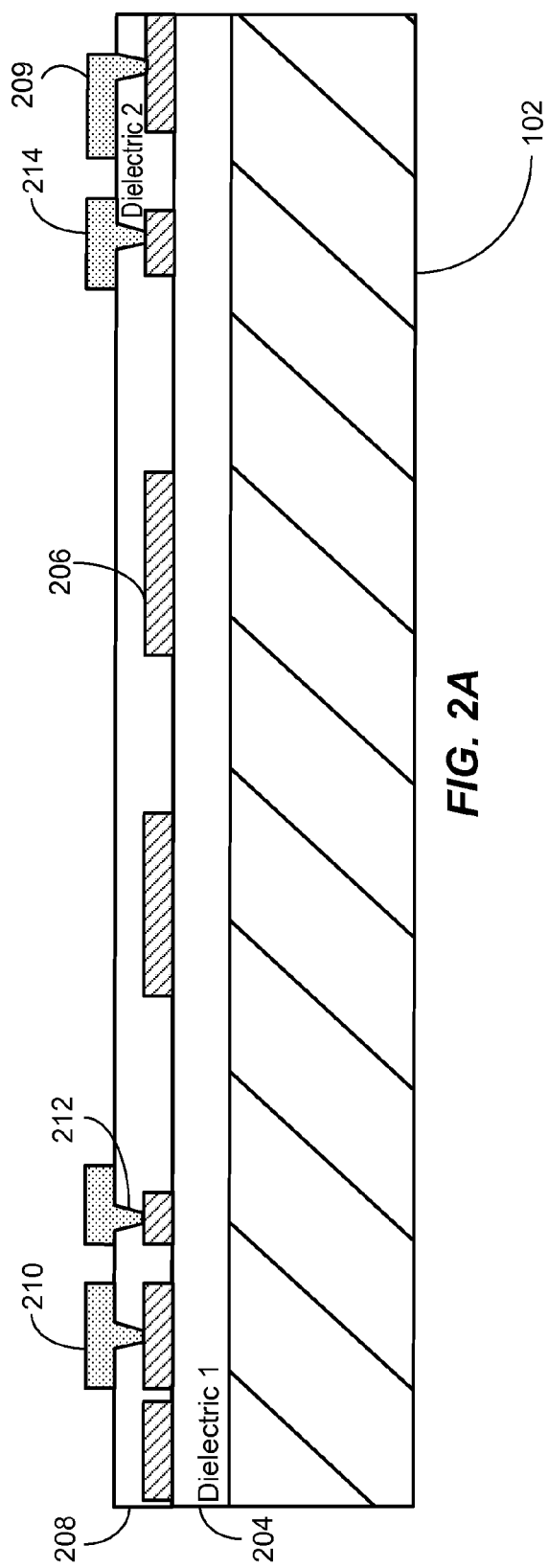

As illustrated in the FIG. 2A, a dielectric layer 204 (Dielectric 1), with a predetermined thickness, is deposited on base substrate 102. Dielectric layer 204 is a silicon dioxide ($SiO_2$) layer in a specific embodiment of the present invention, but this is not required by the present invention. Other suitable materials may be used within the scope of the present invention. For example, dielectric layer 204 may be formed by deposition of silicon nitride ($Si_3N_4$) or silicon oxynitride (SiON) layers in alternative embodiments. Moreover, polysilicon material, including amorphous polysilicon, may be deposited to form dielectric layer 204 in yet another alternative embodiment according to the present invention. Materials with suitable characteristics, including formation of a strong bond with the base substrate 102, good adhesion to base substrate 102, and mechanical rigidity, are acceptable substitutes for $Si_xO_y$ materials. Buffer layers can be used in the deposition of dielectric layer 204 as appropriate to the particular application.

The dielectric layer 204 has a predetermined thickness as initially deposited. In a specific embodiment, the initial thickness is about 1 µm. In other embodiments, the thickness ranges from about 0.01 µm to about 10 µm. Of course, the thickness will depend on the particular application. In some embodiments, the dielectric layer 204 is formed using multiple deposition and polishing steps to form the final layer. As an example, an HDP deposition process could be used to form a first portion of the layer, which is then polished using CMP. Because the device features have varying density as a function of lateral position, the deposited layers may not have a uniform upper surface. Thus, using a multi-step deposition/polish process, a flat and uniform surface can be fabricated. Examples of deposition techniques include TEOS, HDP, CVD, LPCVD, Thermal Oxidation, and the like. Additionally, other materials could be utilized that are capped with a final layer, for example, oxide.

As illustrated in FIG. 2A, the upper surface of the dielectric layer 204 is uniform across the base substrate 102, resulting in a planar surface. As discussed above, a planar surface after the deposition steps is not required by the present invention since polishing steps can be utilized.

In some embodiments of the present invention, the process used to deposit the dielectric layer 204 or layers that form the dielectric layer 204 is performed in light of the structures present on the substrate. For example, in the instance that base substrate 102 is a CMOS substrate, some circuitry on the substrate may be adversely impacted by performing high temperature deposition processes, as these high temperature deposition processes may damage metals or result in diffusion of junctions associated with the circuitry. Thus, in a particular embodiment of the present invention, low temperature deposition, patterning, and etching processes, such as processes performed at temperatures of less than 500° C., are used to form the layers illustrated in FIGS. 2A-2I. In another specific embodiment, deposition, patterning, and etching processes performed at less than 400° C., are used to form the various illustrated layers.

A metal layer 206 is then deposited over the dielectric layer 204. In some embodiments, the metal layer 206 is deposited using electroplating, physical vapor deposition (PVD), or a CVD process. FIG. 2A illustrates the base substrate 102 and patterned metal layer 206 after an etch process. For purposes of clarity, a photolithography process in which a photoresist layer is deposited on the metal layer 206 and patterned to form an etch mask is not shown in this process flow. The dimensions of the etch mask may be tightly controlled during photolithography and the etch mask may be formed from any suitable material that is resistant to the etching process used to etch the metal layer. In a specific embodiment, an etch mask of Silicon Nitride ($Si_3N_4$) is utilized. In other embodiments, a photoresist layer can serve as the etch mask. Although a one dimensional cross section is illustrated in FIG. 2A, it will evident to one of skill in the art that a two-dimensional pattern of the desired geometry is formed in the metal layer. In some embodiments, the metal layer 206 may comprise aluminum, copper, aluminum-copper-silicon alloys, tungsten, or titanium nitride. In some embodiments, the thickness of the metal layer 206 can be between 0.1 μm and 5 μm. In a particular embodiment, the thickness of metal layer 206 is 0.5 μm. The metal layer 206 forms the electrodes, e.g., the sense and the drive electrodes, for the MEMS device assembly as described more fully throughout the present specification.

Thereafter, a second dielectric layer 208 (Dielectric 2) is deposited over the metal layer 206. The process of forming the second dielectric layer 208 and the composition of the second dielectric layer 208 is similar to the first dielectric layer 204 in some embodiments. In other embodiments, the second dielectric layer 208 utilizes different materials and processes than those associated with the first dielectric layer 204. In yet other embodiments, both similarities and differences are found between these two layers. As discussed above, each of the first dielectric layers 204 and the second dielectric layer 208 can be formed using multiple layers (also referred to as sub-layers) as appropriate to the particular application.

After forming the second dielectric layer 208, it is patterned and etched to form a plurality of interconnect vias 212. Interconnect vias 212 provide electrical connection between the metal layer 206 and the subsequent conductive layer that is formed over the second dielectric layer as described more fully below.

A conductive layer 209 is then deposited over the second dielectric layer. The conductive layer 209 also fills the interconnect vias 212. In some embodiments, the vias 212 may be filled separately using a conductive material like tungsten (W). The conductive layer 209 is patterned to form a plurality of first bonding regions 214 and a plurality of second bonding regions 210. The bonding regions 214 and 210 are used to bond the device substrate and the capping layer, respectively, to the base substrate 102. The bonding regions 214 and 210 comprise a electrically conductive material with sufficient structural mechanical rigidity to support a bonding interface. In a specific embodiment, the bonding regions 214 and 210 form a low resistance ohmic contact with the base substrate 102. In some embodiments, the bonding regions 214 and 210 may comprise germanium, aluminum, or copper. In other embodiments, other materials such as gold, indium, or other solders having good adhesion underlying layers and improved wetting capability may be used for the bonding regions. The conductive layer 209 may be formed using similar techniques described above in connection with metal layer 206.

Figure 2B:
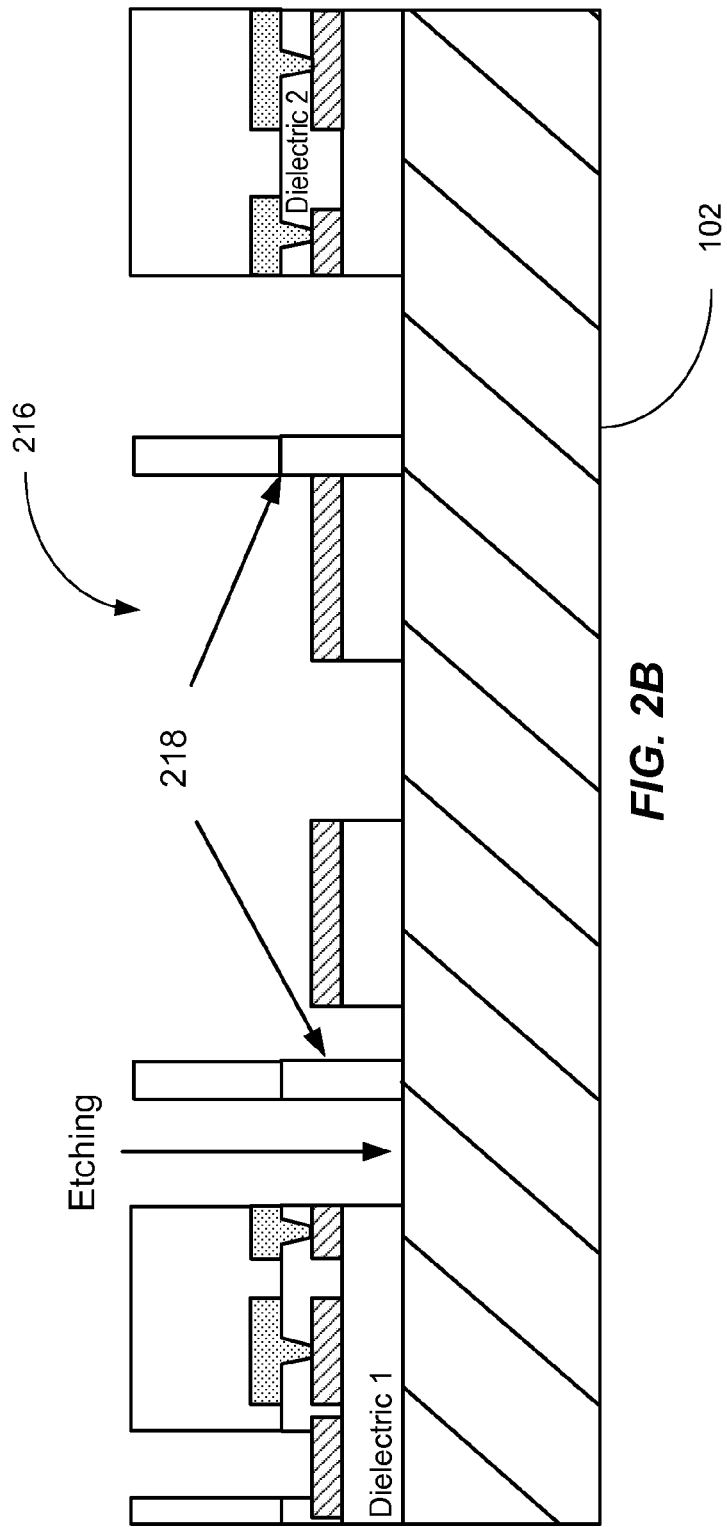

As illustrated in FIG. 2B, a portion of the layers deposited on substrate 102 are patterned and etched to form a recessed region 216 that can accommodate one or more MEMS devices. The etching process may include one or more etching processes including: anisotropic etch, oxide etch, RIE, or the like. The etching process also defines one or more mechanical stopping structures 218 for the MEMS device. In the embodiment illustrated in FIG. 2B, the base substrate 102 serves as an etch stop layer once the desired portions of the first dielectric layer 204 have been removed. As discussed above, one or more buffer layers may be utilized as etch stop layers. One of ordinary skill in the art would recognize many variations, modifications, and alternatives.

FIG. 2C illustrates a device substrate 250. The device substrate 250 may comprise a silicon-based substrate, such as a single crystal silicon substrate. In the specific embodiment illustrated in FIG. 2C, the device substrate is a doped low-resistance silicon substrate. A conductive layer is deposited over the upper surface of the device substrate 250 and is then patterned and etched to form a plurality of bonding areas 252. In other embodiments, the device substrate 250 is first patterned to define the bonding areas followed by electroplating of the desired conductive material on the surface of device substrate 250. The conductive material is then etched to form the final bonding areas 252. In some embodiments, the thickness of the bonding areas 252 is between 0.1 μm and 1 μm. In a specific embodiment, the bonding areas 252 may include an alloy of aluminum and copper. Along with the bonding areas 252, a plurality of cavities 253 are also formed in the device substrate 250. In some embodiments, the cavities 253 may be between 1 μm and 500 μm deep. The cavities 253 help to reduce noise from the base substrate 102 when the device substrate 250 is bonded to the base substrate 102 as described below. In some embodiments, each cavity 253 may be of different depth than the other cavities, enabling creation of a customized device substrate. Although the bonding areas 252 are shown to be disposed on the device substrate 250, in one embodiment, the bonding areas 252 may be disposed on the base substrate 102.

Figure 2D:
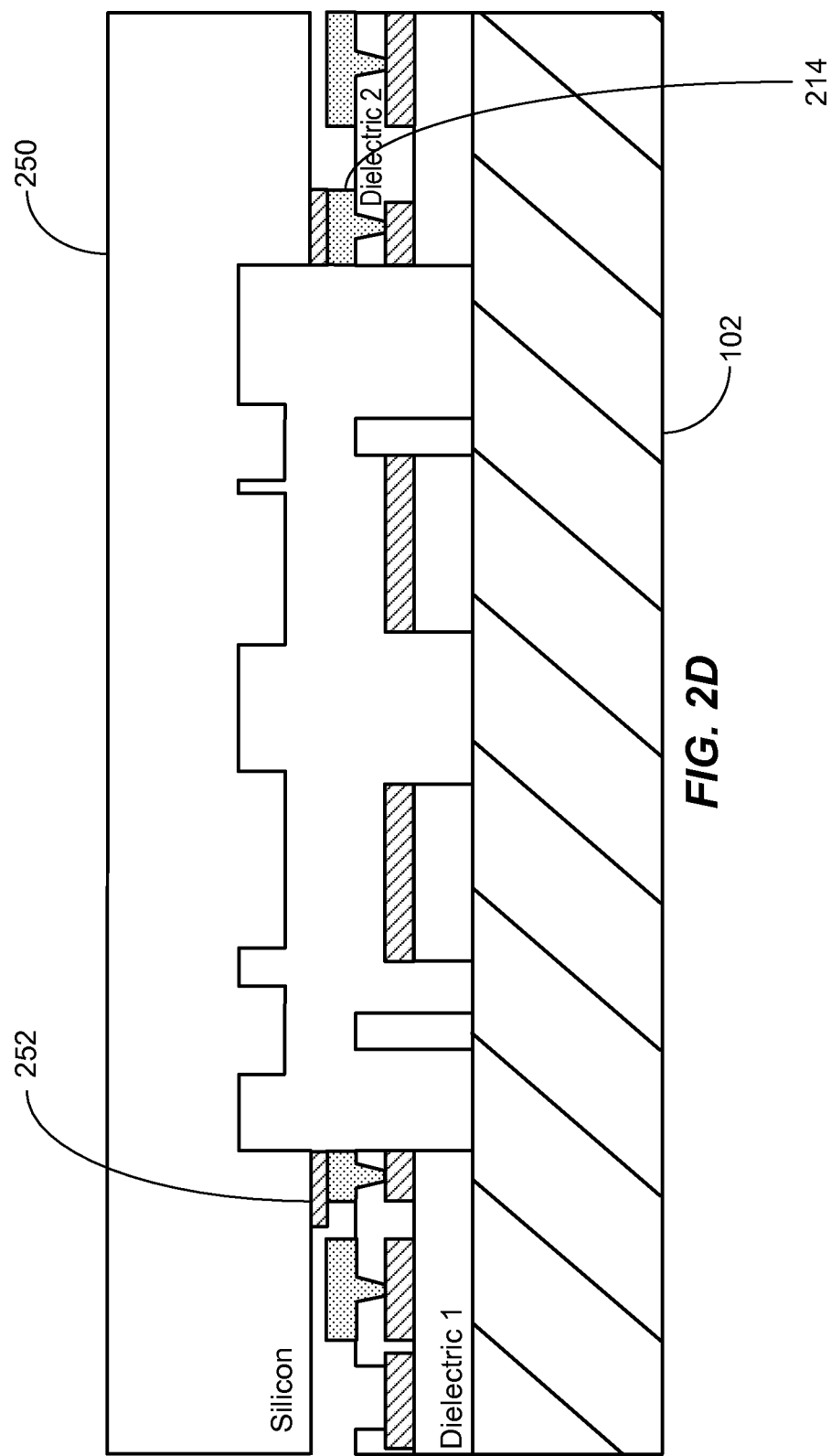

Next, as illustrated in FIG. 2D, the device substrate 250 is bonded to the substrate 102 at the first bonding regions 214. In order to create the bond between the base substrate 102 and the device substrate 250, the bonding areas 252 of the device substrate are brought in contact with the first bonding regions 214 of the base substrate. The bonding interface is then subjected to pressure and heat in order to reflow the conductive material comprised in the first bonding regions 214 and the bonding areas 252. Reflow of the conductive material results in a fused bond structure the provides an ohmic contact between the device substrate 250 and the base substrate 102. The bond between the device substrate 250 and the base substrate 102 is an eutectic bond that is conductive. This eliminates the need for a providing a separate electrical path for the signals between the final MEMS device and the base substrate 102. In some embodiments, the bonding may be achieved using a metal-to-metal fusion bond, e.g., Al—Al, Cu—Cu, or Au—Au. In other embodiments, the ohmic contact (bonding region) may be a multi-layered structure, e.g., comprising Si/Silicide/Ti/TiN/Cu layers. In some embodiments, the device substrate 250 may have different thickness at different regions across the device substrate. In these embodiments, the thickness of the substrate varies as a function of position along one or more directions orthogonal to the thickness of the second substrate, i.e., along directions aligned with the surface of the substrate.

Figure 2E:
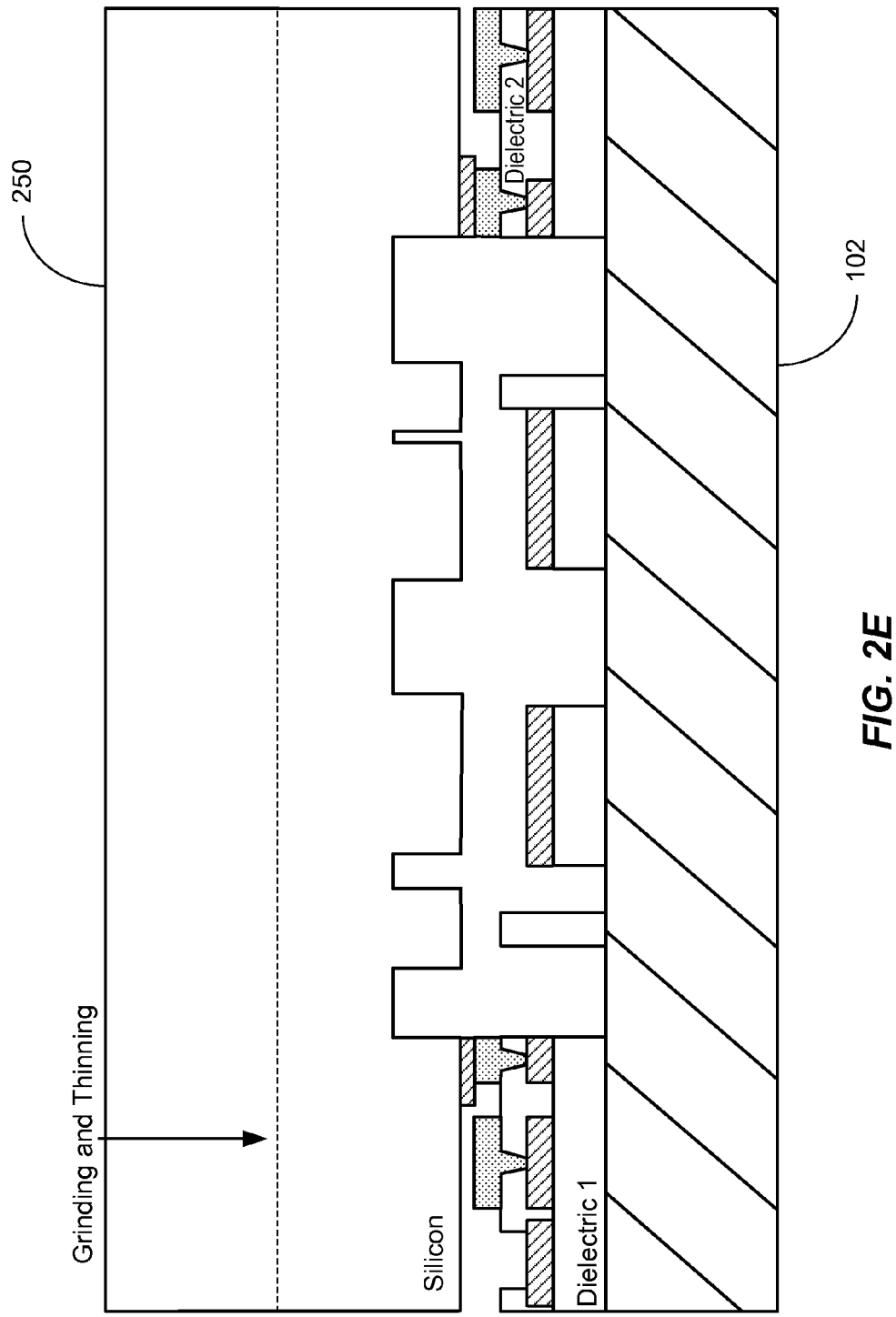

The device substrate 250 is then thinned using a grinding and/or other thinning process to achieve the desired thickness as illustrated in FIG. 2E. In some embodiments, the remaining thickness of the device substrate after thinning is between 1 μm to 500 μm. In a specific embodiment, the final thickness of the device substrate 250 is greater than 20 μm. Conventional thinning techniques like CMP and/or RIE can be used to achieve the desired thickness. For example, a suitable grinding and polishing equipment manufactured by DISCO® Corp. of Japan may be used for the thinning process. One of ordinary skill in the art would recognize many variations, modifications, and alternatives. Precision control of the thinning process is utilized since there is no structure that can be used as a stop layer to terminate the thinning process in the embodiment illustrated in FIG. 2E. If not controlled precisely, the thinning may yield a thinner or thicker than desired device substrate affecting the performance of the MEMS device subsequently fabricated. In other embodiments, an etch stop layer is integrated into device substrate 250 in order to facilitate precision control of the thinning process. One of ordinary skill in the art would recognize many variations, modifications, and alternatives.

Figure 2F:
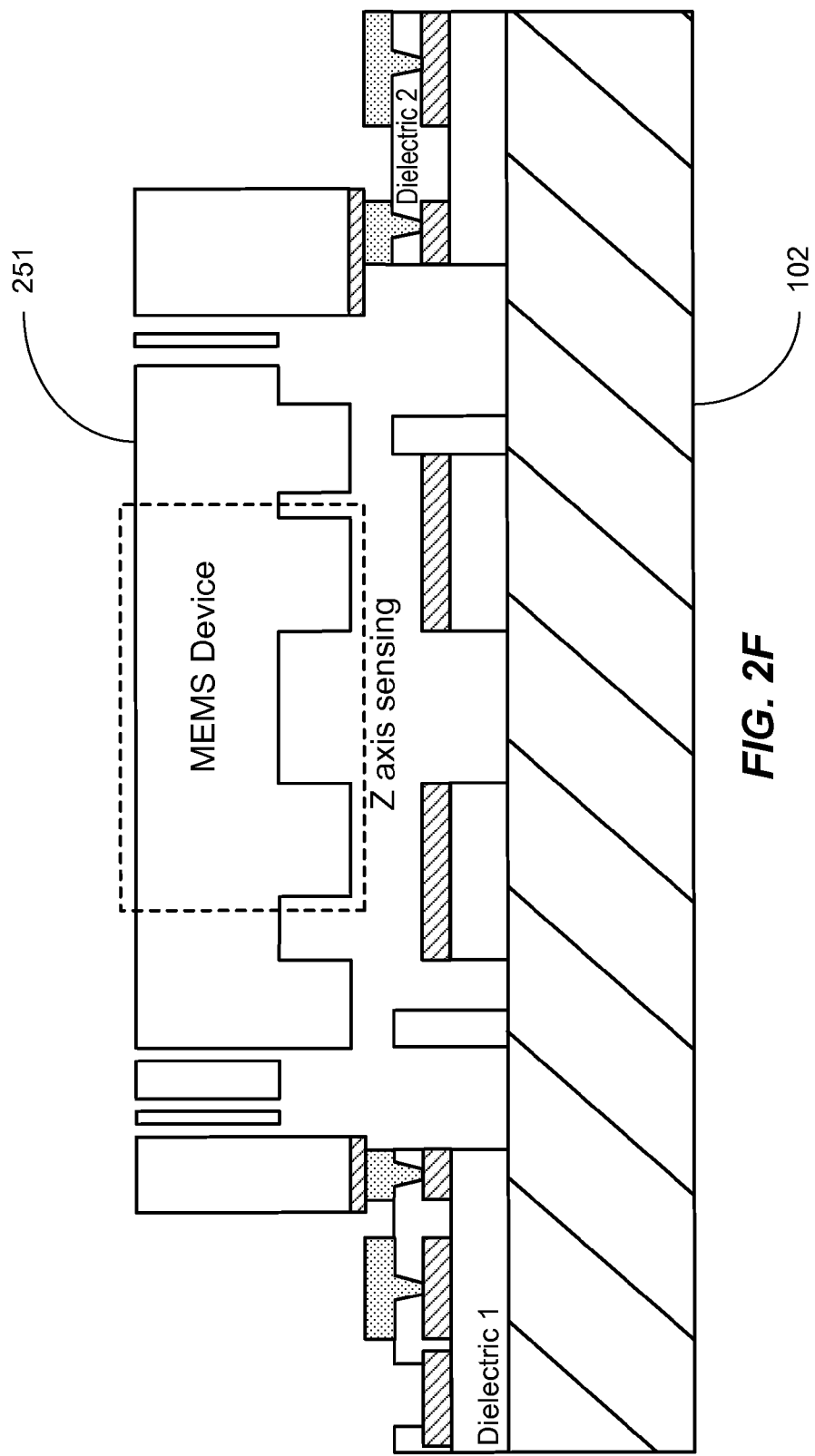

The device substrate is then patterned and etched to form a MEMS device 251 as illustrated in FIG. 2F The patterning and etching techniques used to form the MEMS device vary depending on the type of the MEMS device. For example, the patterning and etching for a MEMS accelerometer is different from the patterning and etching used for a MEMS gyroscope. Conventional etching techniques like anisotropic etching, RIE, or the like may be used. In some embodiments, the thickness of the device substrate 250 can vary as a function of position along the length of the device substrate, where the length is defined along a direction orthogonal to the thickness of the substrate. For example, the device substrate 250 may have a first thickness at one end, a second thickness in the center, and a third thickness at the other end. In this instance, the first, the second, and the third thickness may be different from each other.

Figure 2G:
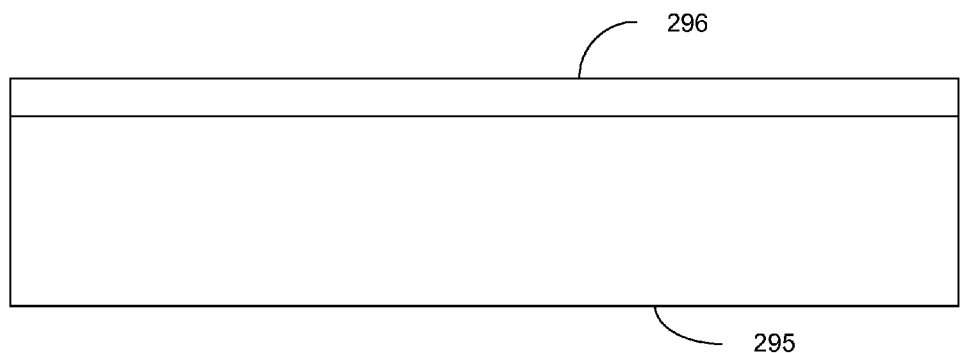

A capping wafer 295 is provided as illustrated in FIG. 2G. In some embodiments, the capping wafer 295 may comprise doped silicon, ceramic with a conductive coating, glass covered with a conductive coating like Indium Tin Oxide (ITO), or a metal such as Tantalum Oxide. An adhesive layer 296 is deposited over the capping wafer 295. The adhesive layer 296 helps with adhesion between the capping wafer 295 and the base substrate 102. In some embodiments, the adhesive layer 296 is formed by depositing a seed layer, e.g., Titanium/Gold followed by deposition of a conductive layer, e.g., Gold electroplating.

Figure 2H:
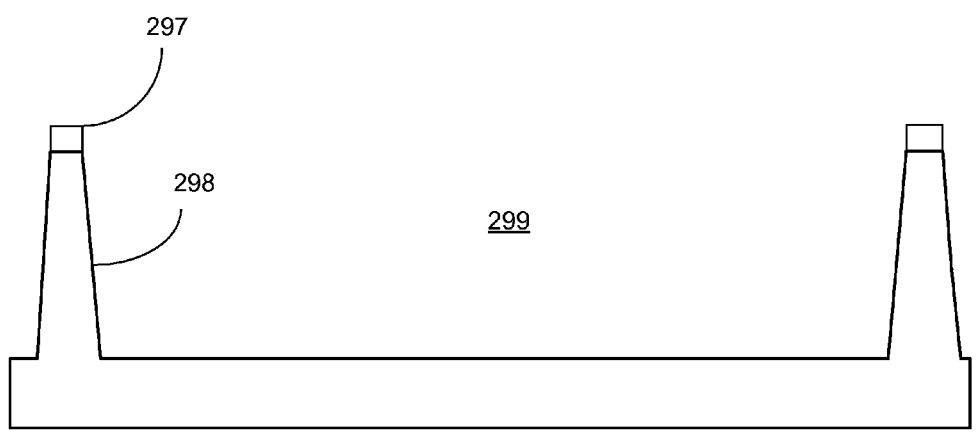

The capping wafer 295 is then patterned and etched to form a plurality of standoff structures 298 as illustrated in FIG. 2H. In some embodiments, the standoff structures may have a height of about 90 μm. The etching of the capping wafer 295 to form the standoff structures 298 results in a cavity 299 being formed in the capping wafer 295. A portion of the adhesive layer 296 is left on the standoff structures 298 and forms bonding areas 297. The cavity 299 can enclose the MEMS device 251 fabricated in the device substrate 250. The lateral dimensions of the cavity are selected based on the geometry of the MEMS device to be covered by the capping wafer.

Figure 2I:
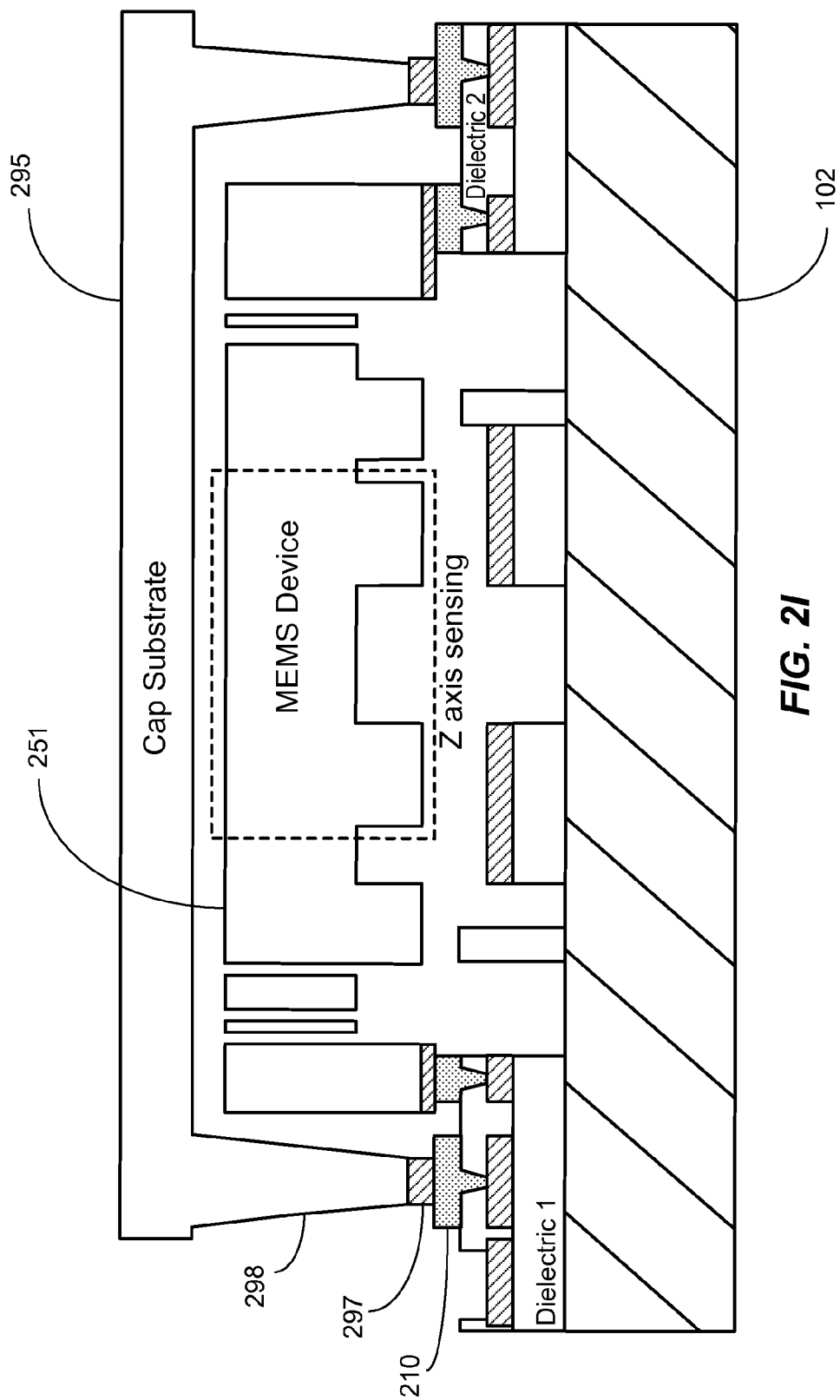

FIG. 2I shows a completed MEMS device assembly after the capping wafer 295 is bonded to the base substrate 102. The capping wafer 295 is bonded to the base substrate 102 as illustrated in FIG. 2I. The bonding is done such that the standoff structures 298 of the capping wafer are in contact with the second bonding regions 210 of the base substrate 102.

The bonding of the capping wafer 295 to the base substrate 102 may also use the eutectic bonding techniques described above. In some embodiments, the temperature used for bonding the capping wafer 295 to the base substrate 102 is lower than the temperature used for bonding the device substrate 250 to the base substrate 102 in order to protect the MEMS device 251. In some embodiments, the bonding temperature is below 400° C. The capping wafer 295 is conductive and provides shielding to the MEMS device from electro-magnetic interference (EMI). The capping wafer 295 also isolates the MEMS device and the electrical devices on the base substrate from the outside environment. Thus, a controlled environment is provided for the MEMS device fabricated according to embodiments of the present invention. In some embodiments, the controlled environment, which can be provided during the operating lifetime of the MEMS device, can include air, dry air, nitrogen, inert gases, or the like at atmospheric or reduced pressure. In a particular embodiment, a vacuum environment is provided as the controlled environment. In some applications, various pressures of $SF_6$ or other high dielectric constant gases are utilized. One of ordinary skill in the art would recognize many variations, modifications, and alternatives.

Figure 3:
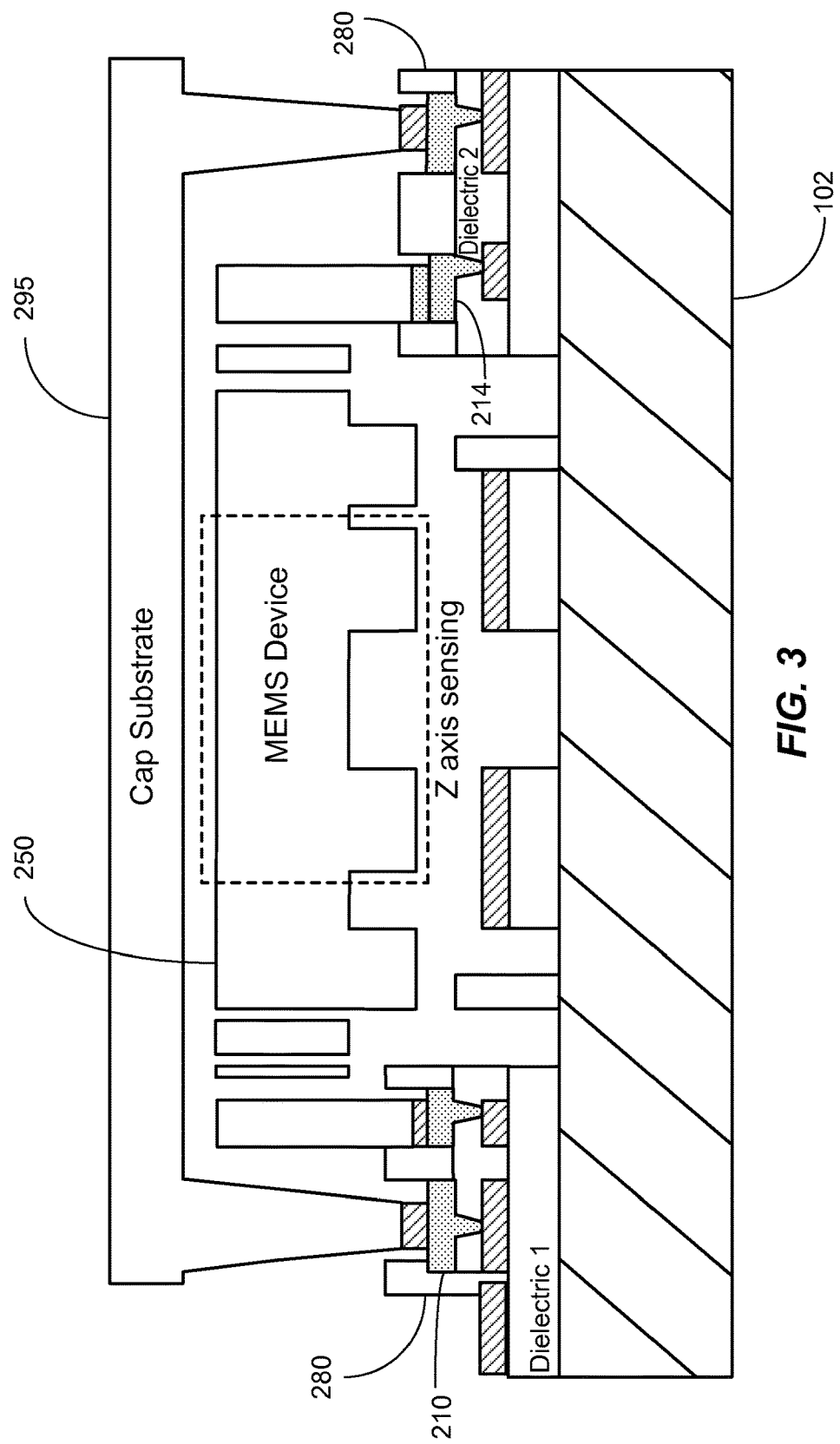
FIG. 3 illustrates a MEMS device package according to another embodiment of the present invention.

FIG. 3 is a cross-sectional view of a MEMS device structure according to another embodiment of the present invention. In this embodiment, the second dielectric layer is patterned to form a plurality of fence posts 280 surrounding the first bonding regions 214 and the second bonding regions 210. The fence posts 280 prevent the migration of the metal in the first and the second bonding regions into the surrounding areas during the process of bonding. For example, without the posts 280, when heat is applied as part of the bonding process, the metal from bonding region 214 may reflow to bonding region 210 or vice versa creating a short and resulting in device failure. The fence posts 280 prevent the flow of metal and help to contain the metal within the first and the second bonding regions. All other processing steps for the embodiment in FIG. 3 are similar to the processing steps described in relation to FIGS. 2A-2I above.

As discussed above, in some embodiments of the present invention, the processes used to deposit, pattern, and etch the dielectric layer or layers are performed at low temperatures. For example, these processing steps may be performed with a view to the structures present on the CMOS substrate prior to the formation of the dielectric layer, such as CMOS circuitry. Since some CMOS circuitry may be adversely impacted by performing high temperature deposition processes, which may damage metals coupling CMOS transistors or result in diffusion of junctions associated with the CMOS circuitry, low temperature deposition processes are utilized according to some embodiments of the present invention. Moreover, in a particular embodiment of the present invention, low temperature deposition, patterning, and etching processes, such as processes performed at temperatures of less than 500° C., are used to form the dielectric layer or layers. In another specific embodiment, deposition, patterning, and etching processes performed at less than 400° C., are used to form the dielectric layer. One of ordinary skill in the art would recognize many variations, modifications, and alternatives within the scope of low temperature processes.

Figure 4:
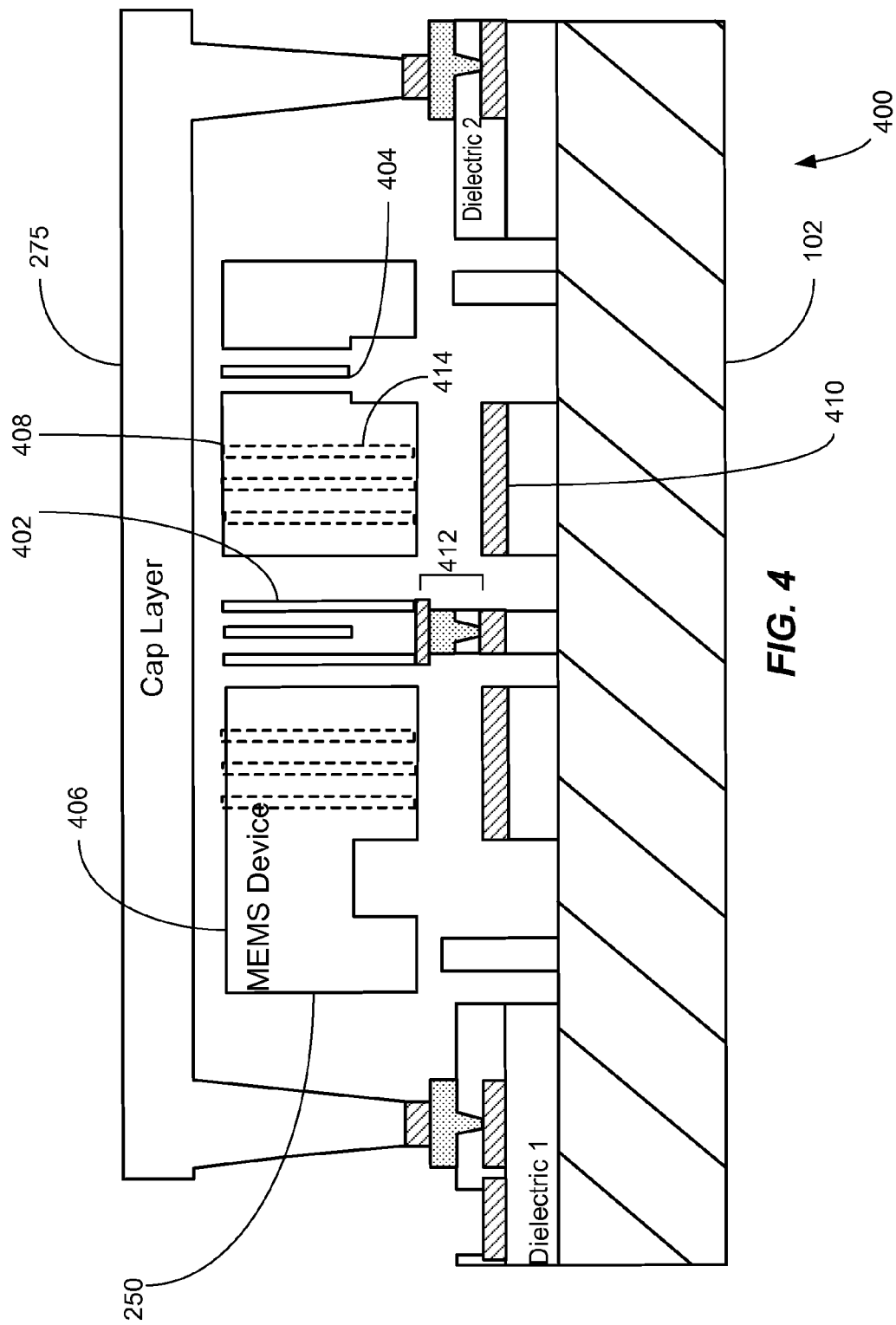
FIG. 4 illustrates a MEMS accelerometer fabricated using embodiments of the present invention.

FIG. 4 is a cross-sectional view of a MEMS accelerometer device 400 fabricated using embodiments of the present invention. Accelerometer 400 has only two layers of metallization and does not need any other electrical path, e.g., a via, to provide the electrical connectivity. Since the capping wafer and the bond between the capping wafer and the base substrate and the bond between the device substrate and the base substrate are conductive, there is no need to provide additional electrical conduction paths. The capping wafer along with the first and second bonding regions provide the electrical connection path for device operation. This significantly simplifies the device structure and fabrication thereby reducing the cost of manufacturing the MEMS device.

As illustrated in FIG. 4, the accelerometer device 400 includes a z-axis motion sensor that comprises a first spring 402 that is anchored to the base substrate 102. The first spring 402 is joined to the base substrate 102 by an ohmic contact interface 412 that reduces or eliminates the need for any other electrical conduction path. The design creates a see-saw like structure where the sensor has two different size elements on either side of the first spring 402. Element 408 is the larger of the two elements and is movable. The other element 406 is connected to the element 408 by the second spring 404 and the entire structure is movable along the first spring 402. Elements 406 and 408 comprise a plurality of through holes 414 that provide the desired damping. The size and amount of holes can be adjusted to get the desired damping. Element 408 is movable and has a second spring 404 located at an edge of the element 406. The addition of the second spring 404 results in a smaller movable plate (not shown separately). The unbalanced structure generates a net torque under an accelerated environment and causes the sensing elements 406 and 408 to rotate along the first spring 402. In some embodiments, the element 408 can further rotate along the second spring 404. The capacitance at each end of the sensing elements 406 and 408 is changed due to the change in gaps between the sensing electrodes 410 and elements 406 and 408 when the entire structure rotates along the first spring 402. The movable sensing element can further rotate along the second spring 404, thereby enabling the element 408 to generate larger capacitance change for larger gap change. Therefore, the capacitance differences between two sensing electrodes becomes larger and there by increases the sensitivity of the sensor. The accelerometer 400 described above is for illustrative purposes only. Many other MEMS device, e.g., a gyroscope, can also be fabricated using techniques described above.

Figure 5A:
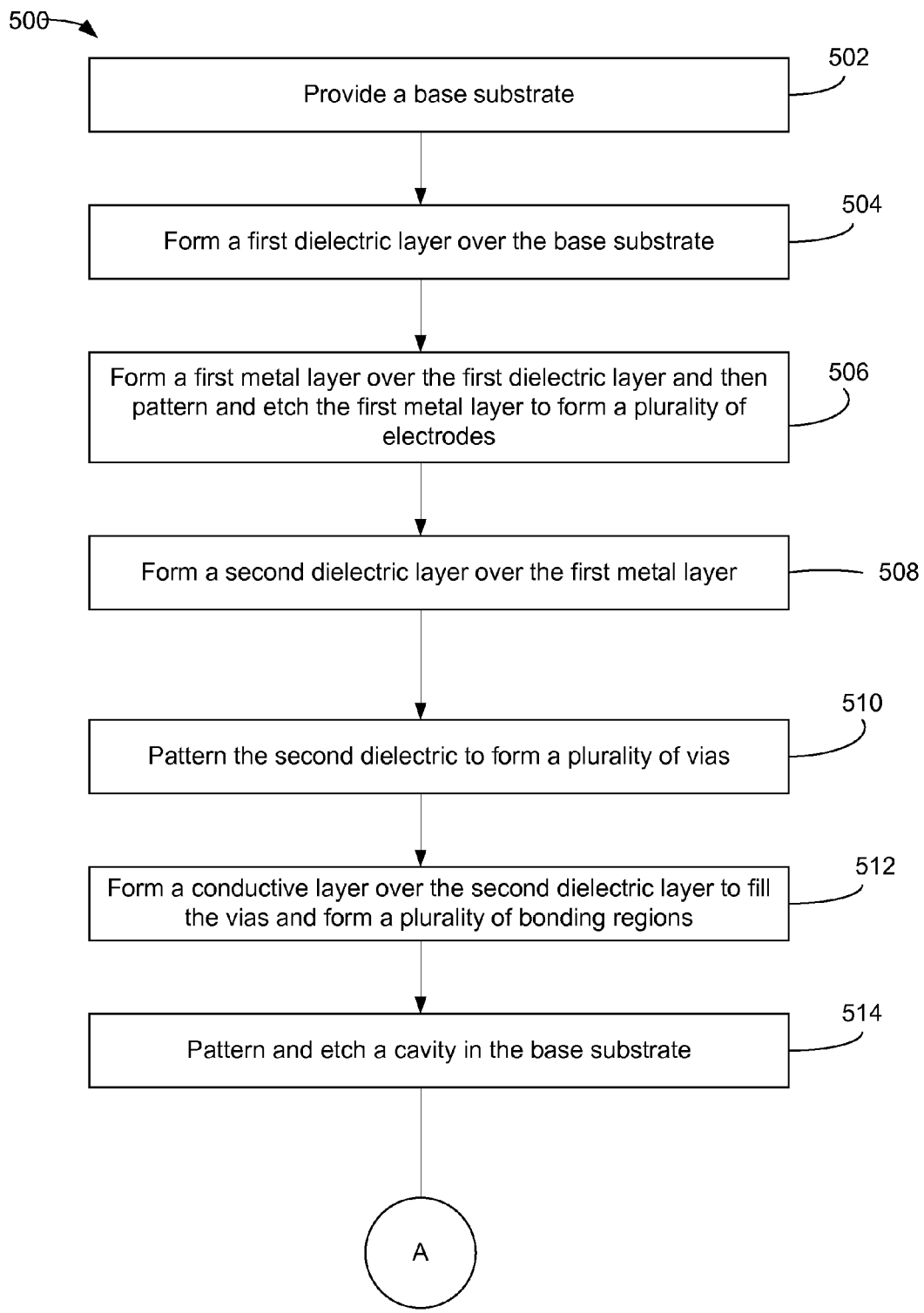
FIGS. 5A and 5B are simplified flowcharts illustrating a process for fabricating the MEMS device of FIGS. 2A-2I according to an embodiment of the present invention.
Figure 5B:
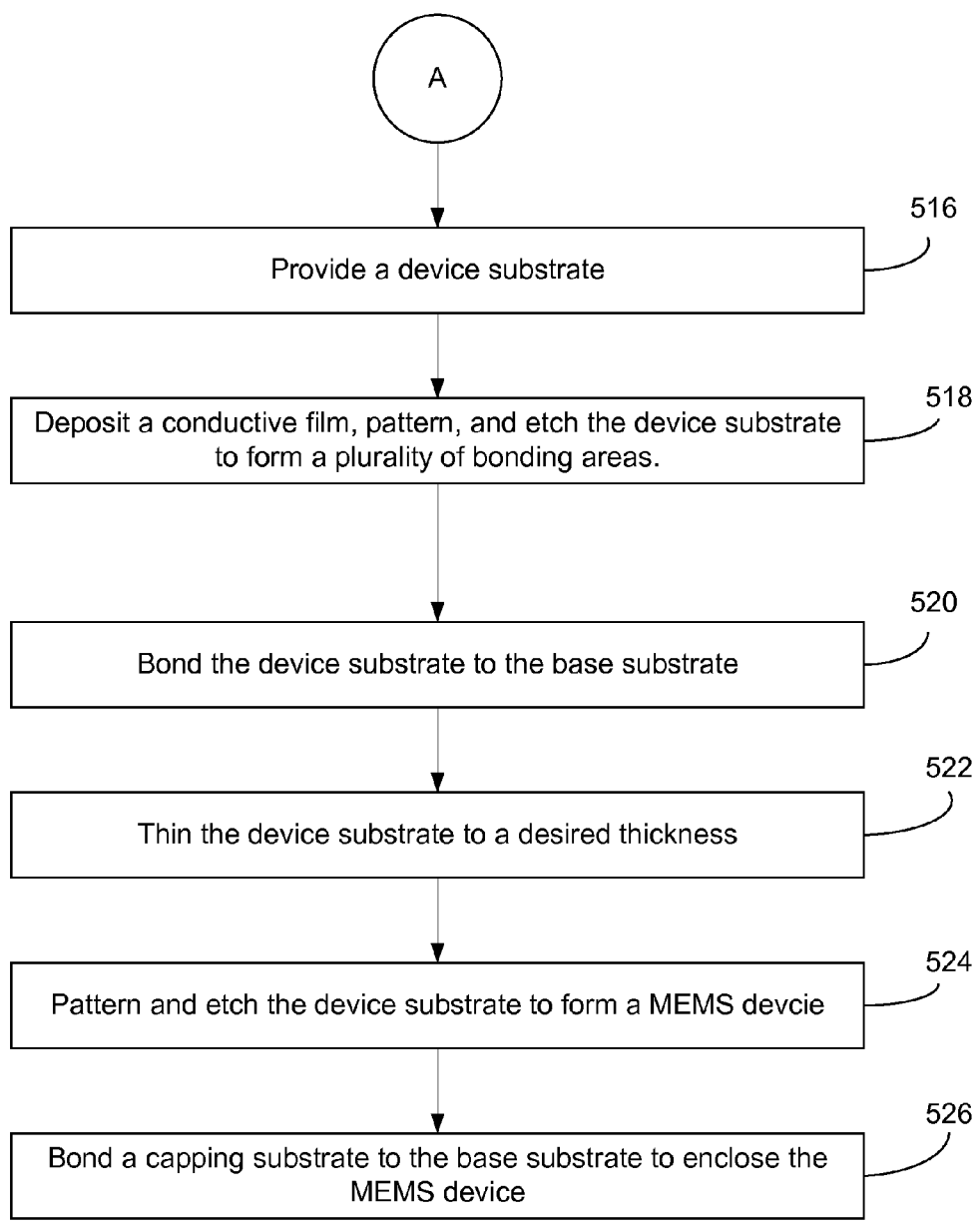

FIGS. 5A and 5B is a flow diagram of a process 500 for fabricating a MEMS device as illustrated in FIGS. 2A-2I according to an embodiment of the present invention. Process 500 includes providing a base substrate (502). A first dielectric layer is formed over the base substrate (504). A first metal layer is deposited over the first dielectric layer. The first metal layer is then patterned and fabricated to form a plurality of electrodes (506). Thereafter a second dielectric layer is deposited over the metal electrodes (508). The second dielectric layer is patterned and etched to form a plurality of vias (510). A conductive layer is then deposited over the dielectric layer such that the conductive material fills the vias. The conductive layer is then patterned and etched to form a plurality of bonding regions (512). The base substrate is then patterned and etched to create a cavity or plurality of cavities and additional structures based on the MEMS device being fabricated (514). For example, for an accelerometer, the mechanical stops for the accelerometer movement can be fabricated during this step.

A device substrate is provided separately (516). A conductive film is deposited over the device substrate, patterned, and etched to create a plurality of bonding regions (518). The device substrate is then bonded to the base substrate (520). The device substrate is then thinned to the desired thickness (522) and then patterned and etched to form a MEMS device (524). A capping wafer with a pre-formed cavity is bonded to the base substrate such that the capping wafer fully encloses the MEMS device (526).

It should be appreciated that the specific steps illustrated in FIGS. 5A and 5B provide a particular method of fabricating a MEMS device according to an embodiment of the present invention. Other sequences of steps may also be performed according to alternative embodiments. For example, alternative embodiments of the present invention may perform the steps outlined above in a different order. Moreover, the individual steps illustrated in FIGS. 5A and 5B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
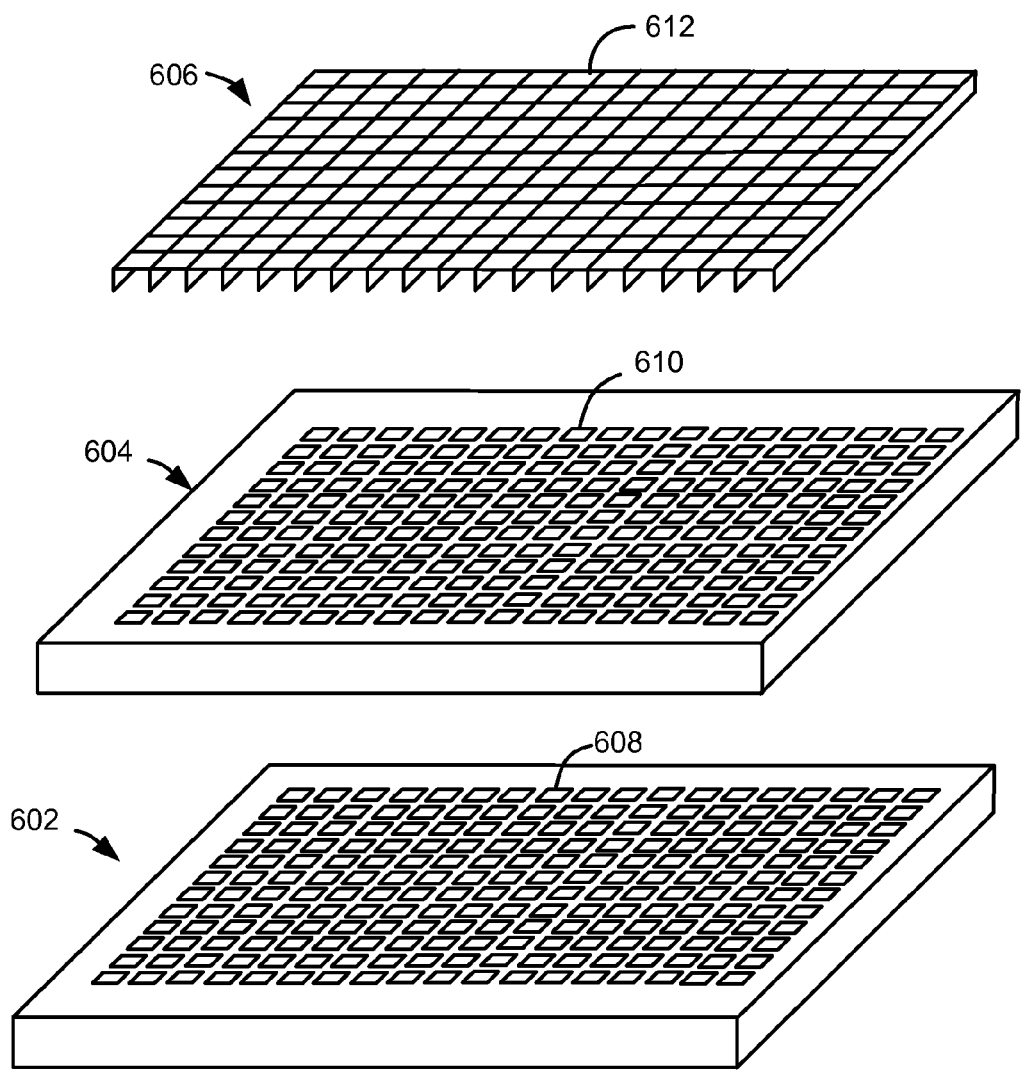
FIG. 6 illustrates packaging of an array of MEMS devices according to an embodiment of the present invention.

MEMS device described above can be fabricated as an array with multiple MEMS devices being fabricated on a single substrate. In this instance, substrate-level bonding is performed to enclose each MEMS device within a die. FIG. 6 shows a base substrate 602 that comprises a plurality of electrical devices 608, e.g., electrodes. A plurality of MEMS device are defined on the device substrate 604 and arranged in form of an array. The device substrate 604 is then bonded to the base substrate 602 using the techniques described above. A plurality of MEMS devices 610 are formed on the device substrate 602 using the fabrication techniques described above. A capping substrate 606 is patterned and etched to create a plurality of cavities 612. The capping substrate 606 is then bonded to the base substrate 602 to enclose each of the MEMS devices 610 in one of the cavities 612. In this manner multiple MEMS devices can be formed at a time.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a micro electro-mechanical (MEMS) device, the method comprising:
   providing a first substrate having a first side and an opposing second side, the first substrate having one or more electrodes and control circuitry formed thereon, wherein the first substrate includes a plurality of first bonding areas in a first bonding region on the first side and a plurality of second bonding areas in a second bonding region on the first side;
   providing a second substrate having a first side and a second side, wherein the second substrate is crystalline;
   forming one or more bonding areas on the first side of the crystalline second substrate;
   forming one or more first topological features of the MEMS device in the first side of the crystalline second substrate;
   after forming the one or more first topological features of the MEMS device, bonding the crystalline second substrate to the first substrate such that that at least a portion of the one or more bonding areas of the crystalline second substrate are in contact with corresponding first bonding areas of the first bonding region of the first substrate and such that the second bonding areas of the second bonding region of the first substrate remain exposed;
   removing a portion of the crystalline substrate to expose a surface of the crystalline second substrate corresponding with a desired thickness of the crystalline second substrate;
   after bonding the crystalline second substrate to the first substrate, patterning and etching the exposed surface of the crystalline second substrate to form one or more additional topological features of the MEMS device in the crystalline second substrate, wherein the additional topological features are formed in addition to the first topological features of the crystalline second substrate formed in the crystalline second substrate prior to bonding the crystalline second substrate to the first substrate;
   providing a capping substrate including a recessed region bordered by standoff structures; and
   bonding the capping substrate to the first side of the first substrate to enclose the MEMS device within the recessed region, wherein bonding the capping substrate to the first side of the first substrate comprises melting the material corresponding second bonding areas of the second bonding region of the first substrate and restricting the melted material from flowing to create an electrical connection between the first and second bonding regions of the first substrate by respectively bounding the plurality of the first and second bonding areas with a plurality of fence posts, wherein the standoff structures are in contact with the second bonding areas of the second bonding region of the first substrate and wherein there is a first electrical path between the crystalline second substrate and the first substrate via the first bonding region and a second electrical path between the capping substrate and the first substrate via the second bonding areas of the second bonding region.

2. The method of claim 1 wherein the plurality of fence posts comprise a dielectric material.

3. The method of claim 1 wherein removing the portion of the crystalline second substrate comprises:
   patterning the second side of the crystalline second substrate; and
   etching the second side of the crystalline second substrate, whereby the exposed surface is exposed.

4. The method of claim 1 wherein bonding the second substrate to the first substrate comprises using eutectic bonding techniques.

5. The method of claim 1 wherein bonding the capping substrate comprises using a conductive eutectic bonding technique.

6. The method of claim 1 further comprising forming one or more recessed regions in the first substrate, the one or more recessed regions configured to accept the MEMS device.

7. The method of claim 1 wherein the first bonding region and the second bonding region provide an ohmic contact.

8. The method of claim 1 wherein:
   bonding the second substrate to the first substrate is performed at a first temperature; and
   bonding the capping substrate to the first side of the first substrate is performed at a second temperature.

9. The method of claim 8 wherein the first temperature is higher than the second temperature.

10. The method of claim 8 wherein the second temperature is lower than 400° C.

11. The method of claim 1 wherein the first substrate is a CMOS substrate.

12. The method of claim 1 wherein the second substrate includes a first region characterized by a first thickness and a second region characterized by a second thickness.

* * * * *